(12) United States Patent
Traub et al.

(10) Patent No.: US 10,739,675 B2
(45) Date of Patent: Aug. 11, 2020

(54) SYSTEMS AND METHODS FOR DETECTION OF AND COMPENSATION FOR MALFUNCTIONING DROPLET DISPENSING NOZZLES

(71) Applicant: CANON KABUSHIKI KAISHA, Tokyo (JP)

(72) Inventors: Matthew C. Traub, Austin, TX (US); Steven C. Shackleton, Austin, TX (US)

(73) Assignee: Canon Kabushiki Kaisha (JP)

( * ) Notice: Subject to any disclaimer, the term of this patent is extended or adjusted under 35 U.S.C. 154(b) by 73 days.

(21) Appl. No.: 15/993,878

(22) Filed: May 31, 2018

(65) Prior Publication Data

US 2019/0369486 A1 Dec. 5, 2019

(51) Int. Cl.
| | |
|---|---|
| *G03F 7/00* | (2006.01) |
| *B29C 43/00* | (2006.01) |
| *G03F 9/00* | (2006.01) |
| *B29C 35/08* | (2006.01) |
| *B29C 59/02* | (2006.01) |
| *B29L 11/00* | (2006.01) |
| *B82Y 10/00* | (2011.01) |
| *B82Y 40/00* | (2011.01) |

(52) U.S. Cl.
CPC ........ *G03F 7/0002* (2013.01); *B29C 35/0805* (2013.01); *B29C 43/003* (2013.01); *B29C 59/022* (2013.01); *G03F 9/7019* (2013.01); *G03F 9/7092* (2013.01); *B29C 2035/0833* (2013.01); *B29L 2011/0016* (2013.01); *B82Y 10/00* (2013.01); *B82Y 40/00* (2013.01)

(58) Field of Classification Search
None
See application file for complete search history.

(56) References Cited

U.S. PATENT DOCUMENTS 5,581,284 A * 12/1996 Hermanson .......... B41J 2/04505
347/40
6,259,962 B1 * 7/2001 Gothait .................. B29C 41/36
700/119
6,533,380 B1   3/2003 Hadimioglu et al.
(Continued)

FOREIGN PATENT DOCUMENTS

JP    2008209439 A    9/2008
JP    2011-222705 A   11/2011
(Continued)

OTHER PUBLICATIONS

Office Action for copending application JP 2019101476 dated Jun. 15, 2020 (Year: 2020).*

*Primary Examiner* — Timothy Kennedy
(74) *Attorney, Agent, or Firm* — Daniel Ratoff

(57) ABSTRACT

An apparatus and method for a dispenser with nozzles configured to eject lines of droplets of formable material onto a substrate in response to ejection signals. The fluid dispenser dispenses a first line of ejected droplets of formable material onto a first location on the substrate. A line camera generates camera signals that are representative of the first line of ejected droplets. The camera signals are analyzed to identify malfunctioning nozzles. The fluid dispenser dispenses a second line of ejected droplets of formable material onto a second location on the substrate that compensates for the one or more malfunctioning nozzles.

20 Claims, 9 Drawing Sheets

(56) References Cited

U.S. PATENT DOCUMENTS

| | | | |
|---|---|---|---|
| 6,849,308 B1* | 2/2005 | Speakman | G03F 7/16 |
| | | | 427/422 |
| 6,936,194 B2 | 8/2005 | Watts | |
| 7,111,755 B2 | 9/2006 | Koyama et al. | |
| 7,157,036 B2 | 1/2007 | Choi et al. | |
| 7,407,256 B2* | 8/2008 | Han | B41J 2/0451 |
| | | | 347/15 |
| 7,962,237 B2* | 6/2011 | Kritchman | B33Y 10/00 |
| | | | 700/119 |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 8,480,933 B2 | 7/2013 | Sreenivasan et al. | |
| 8,529,011 B2 | 9/2013 | Govyadinov | |
| 9,056,465 B2 | 6/2015 | Massen | |
| 9,067,446 B1* | 6/2015 | Moore | B41J 29/02 |
| 9,073,374 B1* | 7/2015 | Moore | B41J 29/38 |
| 9,079,421 B2 | 7/2015 | Kato et al. | |
| 9,079,440 B1* | 7/2015 | Bonino | B41J 29/393 |
| 9,079,441 B1* | 7/2015 | Giacobbi | B41J 29/393 |
| 9,090,113 B1* | 7/2015 | Foley | B33Y 50/02 |
| 9,108,358 B1* | 8/2015 | Herloski | B29C 64/386 |
| 9,114,652 B1* | 8/2015 | Wayman | B41J 29/393 |
| 9,332,902 B2 | 5/2016 | Tumlinson et al. | |
| 9,539,803 B2 | 1/2017 | Michel et al. | |
| 9,546,562 B2 | 1/2017 | Hillier et al. | |
| 9,588,056 B2 | 3/2017 | Fontaine et al. | |
| 9,678,021 B2 | 3/2017 | Urano et al. | |
| 9,616,661 B2 | 4/2017 | Pierik et al. | |
| 9,651,862 B2 | 5/2017 | Fletcher et al. | |
| 2003/0151167 A1* | 8/2003 | Kritchman | B29C 41/48 |
| | | | 264/401 |
| 2006/0054039 A1* | 3/2006 | Kritchman | B33Y 10/00 |
| | | | 101/424.1 |
| 2006/0111807 A1* | 5/2006 | Gothait | B29C 64/386 |
| | | | 700/119 |
| 2006/0158474 A1* | 7/2006 | Van Dam | F04B 47/02 |
| | | | 347/16 |
| 2010/0101493 A1* | 4/2010 | Hodge | B05B 12/004 |
| | | | 118/697 |
| 2010/0104747 A1* | 4/2010 | Truskett | H05K 3/125 |
| | | | 427/230 |
| 2010/0121476 A1* | 5/2010 | Kritchman | B29C 64/393 |
| | | | 700/119 |
| 2010/0142757 A1* | 6/2010 | Sandstrom | G02B 26/105 |
| | | | 382/100 |
| 2010/0323304 A1* | 12/2010 | Daito | G03F 7/16 |
| | | | 430/325 |
| 2011/0194095 A1* | 8/2011 | Mizumura | G03F 1/14 |
| | | | 355/74 |
| 2011/0244379 A1* | 10/2011 | Kajiyama | G02F 1/133516 |
| | | | 430/5 |
| 2012/0026478 A1* | 2/2012 | Chen | G03F 7/70275 |
| | | | 355/53 |
| 2013/0187973 A1* | 7/2013 | De Smet | B41J 2/2052 |
| | | | 347/14 |
| 2014/0246808 A1 | 9/2014 | Tsuji et al. | |
| 2015/0360400 A1 | 12/2015 | Tsurumi | |
| 2016/0263839 A1* | 9/2016 | Miedema | B29C 64/112 |
| 2018/0207875 A1* | 7/2018 | Menchik | G06F 3/1296 |

FOREIGN PATENT DOCUMENTS

| | | |
|---|---|---|
| JP | 5455583 B2 | 3/2014 |
| JP | 2014170840 A | 9/2014 |
| JP | 2015062233 A | 4/2015 |
| JP | 2016015506 A | 1/2016 |
| JP | 2017224730 A | 12/2017 |
| WO | WO-2017/094225 A1 | 6/2017 |

\* cited by examiner

SYSTEMS AND METHODS FOR DETECTION OF AND COMPENSATION FOR MALFUNCTIONING DROPLET DISPENSING NOZZLES

BACKGROUND

Field of Art

The present disclosure relates to systems and methods for detection of and compensation for malfunctioning droplet dispensing nozzles.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that contacts the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, formable material removal, dicing, bonding, and packaging, and the like.

The formable liquid is applied to the substrate as a series of droplets with a specific pattern as described in U.S. Pat. No. 9,651,862 which is hereby incorporated by reference. In order to improve throughput and reduce defectivity, a large number small droplets are dispensed onto the substrate. Theses droplets are applied to the substrate via a linear array of droplet dispensing nozzles. The size of each of the droplets is related to a diameter of an output orifice of each of the nozzles. As the diameter of the output orifice decreases so does the reliability. If a nozzle becomes fully or partially clogged its performance reduces or stops entirely. The effect of a clogged nozzle can be an increase in the defectivity in all subsequent imprints. A clogged nozzle results in a nozzle outage, a missing nozzle, a failed nozzle, or a low-performing nozzle.

An initial missing or low-performing nozzle can be detected during a calibration step. While a nozzle that fails during high-volume manufacturing can impact many lots of wafers and severely impact device yield.

SUMMARY

At least a first embodiment, may be an apparatus comprising: a processor; and a substrate chuck configured to hold a substrate. The apparatus may further comprise a fluid dispenser having a plurality of nozzles. Each nozzle may be configured to eject droplets of formable material onto the substrate in response to ejection signals received from the processor. The fluid dispenser, in response to a first set of ejection signals, may dispense a first line of ejected droplets of formable material onto a first location on the substrate. The apparatus may further comprise a line camera positioned to generate a set of camera signals. A first set of camera signals may be representative of the first line of ejected droplets. The processor may be configured to receive the first set of camera signals. The processor may be further configured to analyze the first set of camera signals to identify one or more malfunctioning nozzles among the plurality of nozzles. The processor may be further configured to generate a second set of ejection signals. In response to a second set of ejection signals the fluid dispenser may be further configured to dispense a second line of ejected droplets of formable material onto a second location on the substrate. The second set of ejection signals may compensate for the one or more malfunctioning nozzles.

In an aspect of the first embodiment, the one or more malfunctioning nozzles may be non-functioning nozzles which do not produce droplets as determined by one or more signals among the first set of camera signals.

In an aspect of the first embodiment, the one or more malfunctioning nozzles are low performing nozzles which produce droplets that are the wrong size or position as determined by one or more signals among the first set of camera signals.

In an aspect of the first embodiment, the apparatus may further comprise: a template chuck configured to hold a template; and a positioning system configured to position the substrate chuck relative to the template chuck, such that the template contacts a first plurality of droplets in a first imprint field on the substrate. The first imprint field may be among a plurality of imprint fields. The first plurality of droplets may include the first line of ejected droplets of formable material. The first plurality of droplets may form a first film between the template and the first imprint field of the substrate after the template contacts the first plurality of droplets. The curing system may be configured to expose the first film to actinic radiation, while the template is in contact with the first film. After the first film has been exposed to actinic radiation, the positioning system may be further configured to position the substrate chuck relative to the template chuck, such that the template does not contact the first film which has been cured by the actinic radiation.

In an aspect of the first embodiment, the positioning system may be further configured to position the substrate chuck relative to the template chuck, such that the template contacts a second plurality of droplets in a second imprint field on the substrate. The second imprint field may be among the plurality of imprint fields. The second plurality of droplets may include the second line of ejected droplets of formable material. The second plurality of droplets may form a second film between the template and the second imprint field of the substrate after the template contacts the second plurality of droplets. The curing system may be further configured to expose the second film to actinic radiation, while the template is in contact with the second film. After the second film has been exposed to actinic radiation, the positioning system may be further configured to position the substrate chuck relative to the template chuck, such that the template does not contact the second film which has been cured by the actinic radiation.

In an aspect of the first embodiment, the second film after it has been cured may include less defects than first film after it has been cured by the actinic radiation.

In an aspect of the first embodiment, the first plurality of droplets may include the second line of ejected droplets of formable material.

In an aspect of the first embodiment, one or more additional lines of ejected droplets of formable material may be dispensed in between the first lines of ejected droplets and the second line of ejected droplets.

In an aspect of the first embodiment, a cylindrical lens may be aligned with the line camera that may be positioned in between the fluid dispenser and the template chuck.

In an aspect of the first embodiment, the apparatus may further comprise one or more lenses. The one or more lenses may be positioned so as to focus the first line of ejected droplets of formable material onto the line camera.

In an aspect of the first embodiment, the one or more lenses may be cylindrical lenses.

In an aspect of the first embodiment, the fluid dispenser may be further configured to dispense M lines of ejected droplets in a first imprint field including the first line of ejected droplets. The line camera may be further configured to obtain N sets of camera signals including the first set of camera signals. Each set of camera signals among the N sets of camera signals may be associated with one of the M lines of ejected droplets. N may be less than M.

In an aspect of the first embodiment, the fluid dispenser may be further configured to dispense fluid from a first set of nozzles in response to the first set of ejection signals. The fluid dispenser may be further configured to dispense fluid from a second set of nozzles in response to the second set of ejection signals. The second set of nozzles may not include the one or more malfunctioning nozzles. One or more nozzles among the second set of nozzles may be offset from the first set of nozzles.

In an aspect of the first embodiment, in a first case if the processor does not identify one or more malfunctioning nozzles then the fluid dispenser may be further configured to dispense a plurality of lines of ejected droplets in an imprint field including the first line of ejected droplets in a single pass. In a second case if the processor does identify one or more malfunctioning nozzles then the fluid dispenser may be further configured to dispense the plurality of lines of ejected droplets in the imprint field including the second line of ejected droplets in two or more passes, and the one or more malfunctioning nozzles are not used to dispense droplets.

In an aspect of the first embodiment, in a first case if the processor does not identify one or more malfunctioning nozzles then the fluid dispenser may be further configured to dispense a plurality of lines of ejected droplets in an imprint field including the first line of ejected droplets in two or more passes. In a second case if the processor does identify one or more malfunctioning nozzles then the fluid dispenser may be further configured to dispense the plurality of lines of ejected droplets in the imprint field including the second line of ejected droplets in the two or more passes, and the one or more malfunctioning nozzles are not used to dispense droplets.

In an aspect of the first embodiment, the line camera may include a plurality of pixels arrayed in one direction. Each pixel among the plurality of pixels may be a photoelectric conversion element. An intensity of electromagnetic radiation detected by each of the pixels of the line camera may be represented by an element of the set of camera signals. Each droplet among the first line of ejected droplets may be associated with one or more elements of the first set of camera signals. The processor may determine if a particular nozzle is a malfunctioning nozzle by comparing one or more elements of the first set of camera signals associated with the particular nozzle to one or more thresholds.

At least a second embodiment, may be a method of manufacturing an article on a substrate with an imprinting apparatus. The method may comprise: holding the substrate; and dispensing a first line of ejected droplets of formable material from a plurality of nozzles onto a first location on the substrate in response to a first set of ejection signals. The method may further comprise generating a set of camera signals from a line camera that are representative of the first line of ejected droplets. The method may further comprise analyzing the first set of camera signals to identify one or more malfunctioning nozzles among the plurality of nozzles. The method may further comprise dispensing a second line of ejected droplets of formable material from the plurality of nozzles onto a second location on the substrate in response to a second set of ejection signals. The second set of ejection signals may compensate for the one or more malfunctioning nozzles.

In an aspect of the second embodiment, the method may further comprise positioning the substrate relative to the template, such that the template contacts a first plurality of droplets in a first imprint field on the substrate. The first imprint field may be among a plurality of imprint fields. The first plurality of droplets may include the first line of ejected droplets of formable material. The first plurality of droplets may form a first film between the template and the first imprint field of the substrate after the template contacts the first plurality of droplets. The method may further comprise exposing the first film to actinic radiation, while the template is in contact with the first film. The method may further comprise positioning the substrate relative to the template, such that the template does not contact the first film which has been cured by the actinic radiation.

In an aspect of the second embodiment, positioning the substrate relative to the substrate may include moving the substrate relative to the plurality of nozzles and the line camera. The first set of camera signals may be generated as the substrate moves from under the plurality of nozzles to under the template.

In an aspect of the second embodiment, may further comprise performing additional processes for device fabrication on the substrate so as to manufacture the article.

At least a third embodiment, may be an apparatus comprising: a processor; and a substrate positioning stage configured to move a substrate. The apparatus may further comprise a fluid dispenser having a plurality of nozzles, each nozzle configured to eject droplets of formable material onto the substrate on the substrate positioning stage. The apparatus may further comprise a template chuck configured to hold a template. The apparatus may further comprise a line camera arranged on a straight line connecting the template chuck and the fluid dispenser and including a plurality of pixels arranged in a direction crossing the straight line. The line camera may be positioned to generate a set of camera signals representing a line of droplets ejected from the plurality of nozzles in response to an obtained light from the substrate moving together with the substrate positioning stage. The processor may be configured to analyze the set of camera signals to identify one or more malfunctioning nozzles among the plurality of nozzles.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
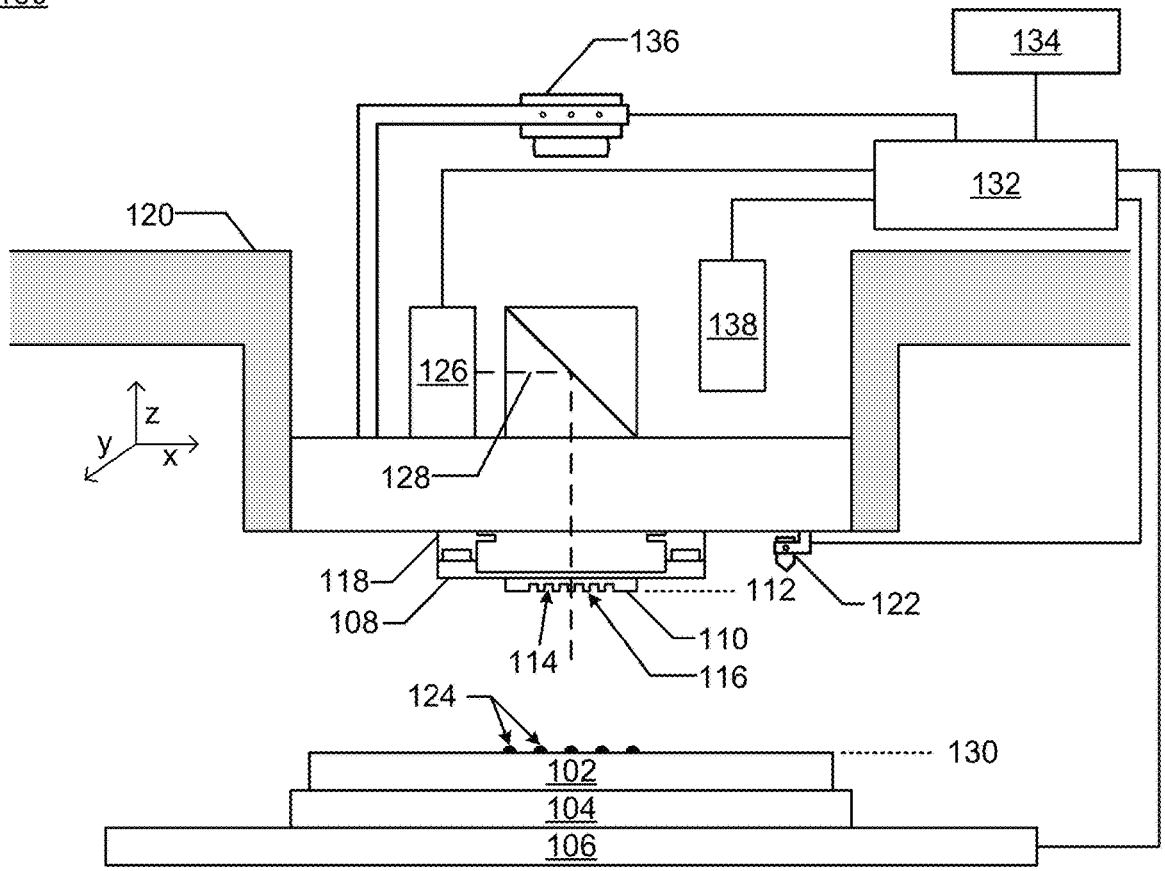
FIG. 1 is an illustration of a nanoimprint lithography system having a template and a mold spaced apart from a substrate.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a systems and/or methods that can quantify the performance of the fluid dispensing nozzles during the imprinting process while not impacting throughput and address issues as they arise.

Nanoimprint System

FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type, groove-type, electrostatic, electromagnetic, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102. The mesa 110 may have a patterning surface 112 thereon. Alternatively, the template 108 may be formed without the mesa 110, in which case the surface of the template facing the substrate 102 is equivalent to the mold 110 and the patterning surface 112 is that surface of the template 108 facing the substrate 102.

The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 comprises features defined by a plurality of spaced-apart template recesses 114 and/or template protrusions 116, though embodiments of the present invention are not limited to such configurations (e.g., planar surface). The patterning surface 112 defines a pattern that forms the basis of a pattern to be formed on the substrate 102. In an alternative embodiment, the patterning surface 112 is featureless in which case a planar surface is formed on the substrate. The featureless patterning surface 112 may be the same size as the substrate 102 and may be used to planarize the substrate 112.

Template 108 may be coupled to a template chuck 118. The template chuck 118 may be, but is not limited to, vacuum, pin-type, groove-type, electrostatic, electromagnetic, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes). The positioning system may include one or more motors which move template 108.

Nanoimprint lithography system 100 may further comprise a fluid dispenser 122. The fluid dispenser 122 may be used to deposit formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, and piezoelectric ink jetting are common techniques for dispensing jettable liquids.

The nanoimprint lithography system 100 may further comprise an energy source 126 that directs actinic energy along an exposure path 128. The Imprint head and the substrate positioning stage 106 may be configured to position the template 108 and the substrate 102 in superimposition with the exposure path 128. A camera 136 may likewise be positioned such that an imaging field of the camera 128 is in superimposition with the exposure path 128.

The nanoimprint lithography system 100 may be regulated, controlled and/or directed by one or more processors 132 (controller) in communication with one or more components and/or subsystems such as the substrate positioning stage 106, the imprint head, the fluid dispenser 122, the source 126, and/or the camera 136 and may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory includes but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head, the substrate positioning stage 106, or both varies a distance between the mold 110 and the substrate 102 to define a desired volume that is filled by the formable material 124. For example, the imprint head may apply a force to the template 108 such that mold 110 is in contact with the formable material 124. After the desired volume is filled with the formable material 124, the source 126 produces energy, e.g., actinic radiation (UV), causing formable material 124 to solidify and/or cross-link conforming to a shape of the substrate surface 130 and the patterning surface 112, defining a patterned layer on the substrate 102. Thus the nanoimprint lithography system 100 uses an imprinting process to form the patterned layer which has recesses and protrusions which are an inverse of the pattern in the patterning surface 112.

The imprinting process may be done repeatedly in a plurality of imprint fields that are spread across the substrate surface 130. Each of the imprint fields may be the same size as the mesa 110 or just the pattern area of the mesa 110. In an alternative embodiment, the substrate 102 has only one imprint field which is the same size as the substrate 102 or the area of the substrate 102 which is to be patterned with the mesa 110.

The patterned layer may be formed such that it has a residual layer having a residual layer thickness (RLT) above a highest point on the substrate surface 130 in each imprint field. The patterned layer may also include one or more features such as protrusions which extend above the residual layer having a thickness. These protrusions match the recesses 114 in the mesa 110.

Fluid Dispenser

Figure 2A:
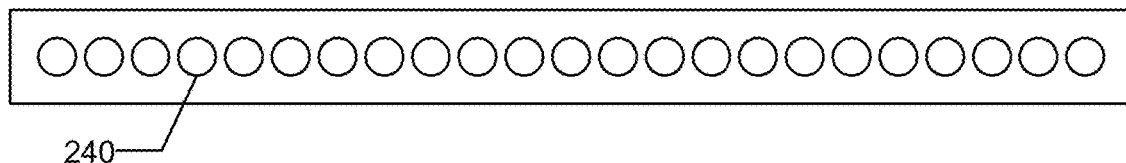
FIGS. 2A-B are illustrations of fluid dispensers as may be used in an embodiment.
Figure 2B:
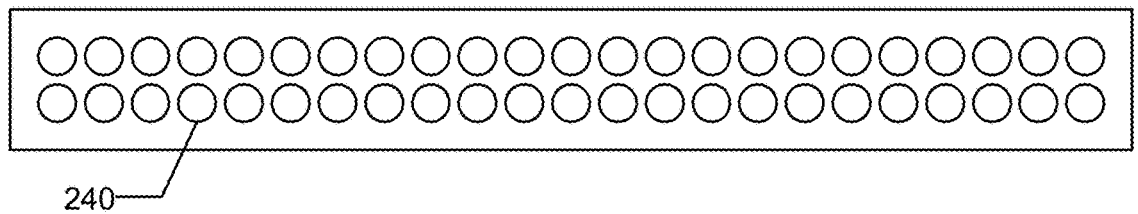

An exemplary fluid dispenser 122 includes a plurality of nozzles 240 which are scanned across an imprint field on a substrate 102 to produce an array of droplets. In an embodiment, scanning the fluid dispenser 122 across the imprint field may include using the substrate stage 106 to move the substrate 102 back and forth under the fluid dispenser 122. In an exemplary embodiment, fluid dispenser 122a includes a single row of nozzles as illustrated in FIG. 2A. In an alternative embodiment, fluid dispenser 122b includes multiple rows of nozzles as illustrated in FIG. 2B. In an alternative embodiment, the fluid dispenser includes multiple rows in which one more rows are offset from one or more other rows. In an embodiment, the fluid dispenser 122 is positioned above the substrate 102 at a dispense height ($z_d$). In an alternative embodiment, the fluid dispenser 122 has an independent fluid dispenser positioning system which may be used in combination with the substrate stage 106 and/or a template positioning system to scan or adjust the scan of the fluid dispenser 122 across the imprint field.

Droplet Inspection System

Figure 3A:
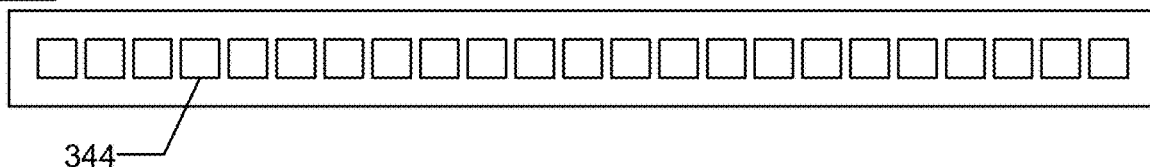
FIGS. 3A-C are illustrations of cameras as may be used in an embodiment.
Figure 3B:
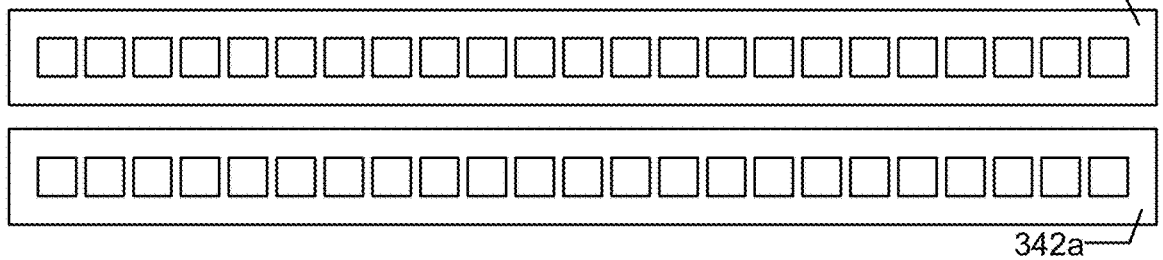
Figure 3C:
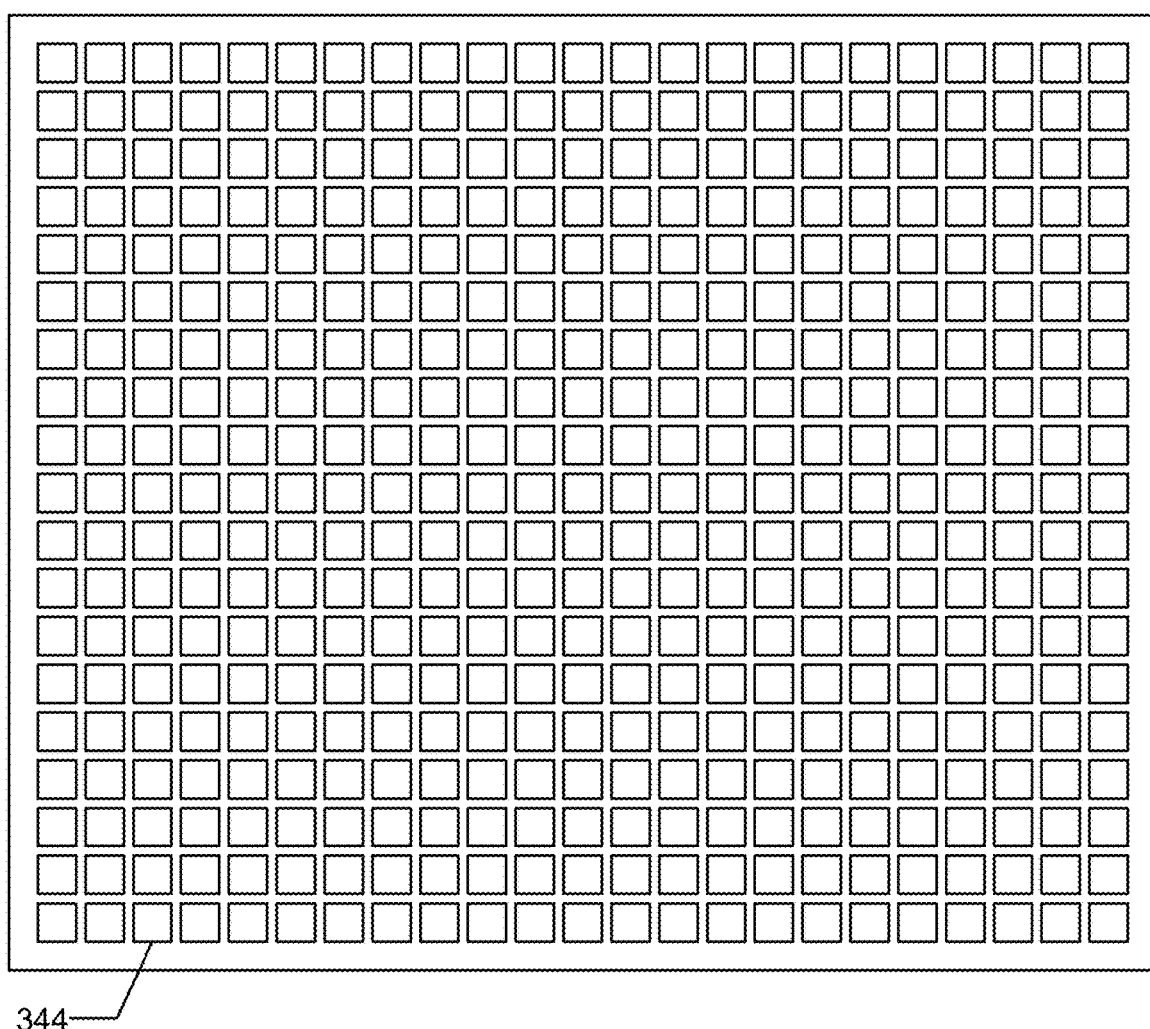

The nanoimprint lithography system 100 may include a droplet inspection system 138. The droplet inspection system 138 may include a line camera 342a as illustrated in FIG. 3A. One or more components of the droplet inspection system 138 may be secured to the bridge 120. In an embodiment, the bridge 120 may include one or more inspection ports in which droplet inspection system 138 views droplets dispensed by the fluid dispenser 122. In an embodiment, an inspection lens may be secured underneath the bridge 120 close to the droplets while the line camera 342a is above the bridge. The inspection lens may be secured at a focal height that is greater than the dispense height ($z_d$). The line camera 342a may be positioned between the fluid dispenser 122 and the template chuck 118. In an alternative embodiment, the droplet inspection system 122 may include one or more optical components that allow the line camera 342a to inspect droplets on the substrate 102 from a position other than between the fluid dispenser 122 and the template chuck 118. In an embodiment, the line camera 342a includes a plurality of pixels 344 arrayed in one direction as illustrated in FIG. 3A. In alternative embodiment, the droplet inspection system includes multiple line cameras 342a as illustrated in FIG. 3B or a single line camera with a limited number of rows (one to four) along a single dimension. In a comparative example, the droplet inspection system 138 may include a 2D photodiode array 342c as illustrated in FIG. 3C. For an area sensor such as 2D photodiode array 342c, optical components are used to project an image onto the sensor that has X by Y pixels.

In an alternative embodiment, the line camera 342a may be arranged on a straight line connecting the template chuck 118 and the fluid dispenser 122. The line camera 342a may include a plurality of pixels 344 arranged in a direction crossing the straight line connecting the template chuck 118 and the fluid dispenser 122. The line camera 342a may be positioned to generate a set of camera signals that represent a line of droplets ejected from the plurality of nozzles in response to an obtained light from the substrate 102 moving together with the substrate positioning stage 106. The processor 132 may be configured to analyze the set of camera signals to identify one or more malfunctioning nozzles among the plurality of nozzles. The direction in which the plurality of pixels 344 is arranged may be orthogonal to the straight line connecting the template chuck 118 and the fluid dispenser 122.

After an exposure in the comparative example, the entire 2D sensor is typically read out before another image is collected. For example, a 1 megapixel 1000×1000 sensor array, with 5 μm×5 μm pixels will have a physical size of 5 mm×5 mm. If the pixel clock is 40 MHz, then the frame read out time is 25 milliseconds (ms) and the maximum frame rate is 40 frames per second (fps). The applicant has found that a single frame will only show about 70 droplets dispensed at 360 drops per inch (dpi) for a 1:1 image. The applicant has found that it takes about 350 ms to obtain an image of droplets corresponding to every nozzle in the nozzle array direction. A line scan camera 342a can be read out faster than such a 2D sensor 342c because it is gathering much less information. For example, a 1×8000 line camera, with 5 μm×5 μm pixels will have a sensor size of 5 μm×40 mm. If the pixel clock is 40 MHz, then the frame read out time is 0.2 ms and the maximum frame rate is 5000 fps. If the substrate 102 is moved under the line scan camera 342a a more complete image is obtained. A single line camera 342a could inspect every droplet on a standard imprint field with a substrate positioning stage 106 moving at 1 m/s. For whole wafer inspection multiple line cameras 342a may be used. In an alternative embodiment, the single line camera 342a may skip the inspection of one or more lines of droplets. In an alternative embodiment, the single line camera 342a inspects a specific subset of lines of droplets that includes at least the last line of droplets, assuming that once a nozzle starts to malfunction it will continue to malfunction. This will not identify intermittent nozzle malfunctions, but will capture malfunctions that are continuously in a malfunctioning state.

As the number of nozzles used to dispense increases, and the diameter of the nozzle decreases, the probability that a nozzle will malfunction during the imprinting process increases. An imprinting system 100 may include an off-line check on the performance of the fluid dispenser between individual substrates and lot of substrates. In which case, every imprint field in between the time of failure of a nozzle 344 and the time of discovery is impacted. In an embodiment, every nozzle in use is checked for malfunction at some point during the imprinting process. Immediate detection of a malfunctioning nozzle can be followed by one or more of: an automated maintenance procedure; a manual maintenance procedure; a change in which nozzles are used; a purge of a malfunctioning nozzle; a replacement of the fluid dispenser 122; a droplet placement adjustment; additional dispensing pass; or other compensation methods. In an embodiment, droplet inspection system 138 is done on the drops dispensed on the imprint field before the template is brought into contact with the substrate 102.

In an embodiment, the automated maintenance procedure may include moving the fluid dispenser 122 to a dispenser cleaning station which includes one or more cleaning components that can be used to improve the performance of the fluid dispenser 122. Examples of such cleaning components includes: a cleaning material which is used to wipe the nozzles of the fluid dispenser 122; a reservoir, a tub, or a plate that may be used to capture the clogged fluid which is ejected by a cleaning ejection process, in which a higher voltage or pressure is used to clear a clogged nozzle; a suction cap which is used to pull fluid out of the clogged nozzle; substituting the malfunctioning fluid dispenser for a backup fluid dispenser; etc.

In an embodiment, the manual maintenance procedure, may include notifying an operator that maintenance needs to be scheduled. The manual maintenance procedure, may include, pausing or stopping the imprinting process. In an embodiment, the position of the array of nozzles is shifted relative to the imprint area and the choice of nozzles in the array of nozzles which are being used is changed. In an embodiment, a single pass dispense pattern is changed to a multi-pass dispense pattern. In an embodiment, a multi-pass dispense pattern is adjusted to compensate for the malfunctioning nozzle.

In an embodiment, droplet placement adjustment may include one or more of: shifting which nozzles that are used to eject the droplets; changing the calibration offset of the substrate positioning stage 106 for the fluid dispenser 122; changing a calibration offset for one or more positioning systems which move the fluid dispenser 122 relative to the substrate 102, etc.

In an embodiment, there is a limited amount of space available for metrology within the nanoimprint lithography system 100. The droplet inspection system 138 may be configured so that it does not substantially increase the amount of time between the dispensing step and the imprinting step and substantially increase the amount of heat experienced by the template 108. In an embodiment, the droplet inspection system 138 is located within a narrow gap between the fluid dispenser 122 and the template chuck 118. The applicant has found that when the fluid dispenser 122 is operated in a back and forth dispensing pattern it is helpful for the droplet inspection system 138 to be located between the template chuck 118 and the fluid dispenser 122. The applicant has found that the width of droplet inspection system 138 has a direct impact on throughput of the nanoimprint lithography system 100, as it increases the travel time between dispense and imprint. The applicant has found that it is advantageous to use a line camera which can be inserted between the template chuck 118 and the fluid dispenser 122 with minimal to no adjustment of their relative positions. In an alternative embodiment, the droplet inspection system 138 can be placed next to the fluid dispenser 122 opposite from the template chuck 118.

A line camera 342a consists of a single line of pixels 344. The total readout time for obtaining a line image from a line camera 342a is faster than the readout time for obtaining a 2D image from a 2D photodiode array 342c such as used in a standard camera described in the comparative example. The applicant has found that if placed in the proper position the line camera 342a can obtain rapid snap shots of a fixed line perpendicular to the direction of travel. In an embodiment, the pixels 344 of the line camera 342a are aligned along the direction of the nozzles. The applicant has found that, a single line image can capture the presence or absence of drops from every nozzle. The applicant has also found that, the single line image can be used to distinguish drops which are too small or too large, which is indicative of a malfunctioning nozzle. An embodiment, may include increasing the ejection signal for a particular nozzle when the particular nozzle is determined to be a malfunctioning nozzle that produces droplets that are too small. An embodiment, may include decreasing the ejection signal for a particular nozzle when the particular nozzle is determined to be a malfunctioning nozzle that produces droplets that are too large.

In an embodiment, the line camera 342a may have 3.5 μm pixels and a sensor width of 55 mm. An alternative embodiment, may include multiple line cameras or line cameras with multiple rows which may be used to cover a larger area or multiple dispensers. At 1:1 magnification, a drop with a diameter of 70 μm would spread across ~20 pixels. In addition to determining whether drops are missing, this provides sufficient spatial resolution to measure major volume deviations based on pixel count, contrast ratio, etc.

In a step and repeat nanoimprint lithography system, image processing may be done during the imprinting process to detect drop volume deviations or missing droplets before the next imprint field is dispensed. In an embodiment, upon detection of drop volume deviations or missing droplets, further imprints may be stopped to prevent non-fill defects or template damage on subsequent imprints. In another embodiment, the imprinting process is adjusted based upon detection of drop volume deviations or missing droplets. Examples of how the process may be adjusted may include specific recovery procedures such as: shifting pre-dispense Y; nozzle purging; or other recovery methods. A blank substrate or other offline testing method may be used to confirm successful recovery before resuming.

In another embodiment, it is possible to measure nozzle outages before an imprint is performed on the dispensed drops. In an embodiment, the recovery procedure may include: adding additional passes, which will allow functional nozzles to fill in gaps from missing nozzles. This process can increase tool uptime. An embodiment, may include multiple dispensers.

The applicant has found that it is advantageous to use cylindrical lenses in which the curved axis is perpendicular to the direction in which the line of pixels are arrayed and the planar axis of the central radius is aligned with the line of pixels. The applicant has found that this improves the throughput by allowing the fluid dispenser to be closer to template chuck. Line scan cameras typically use standard spherical optics for imaging. Cylindrical lenses allow for a longer working distance and can have better spatial resolution. Cylindrical lenses will only project an image along one dimension, but if that dimension is aligned with the pixels in the line scan camera, they are sufficient.

In an alternative embodiment, the droplet inspection system 138 is also capable of detecting particles on the substrate 102. The substrate 102 and/or template 108 may be a roll to roll web. After particles on the substrate 102 are detected, then the substrate 108 may be removed from the nanoimprint lithography system 100 or transferred to a substrate cleaning station within the nanoimprint lithography system 100. Particle detection on the substrate 102 may be used to prevent damage to the template 108.

Droplet Inspection Method

Figure 4A:
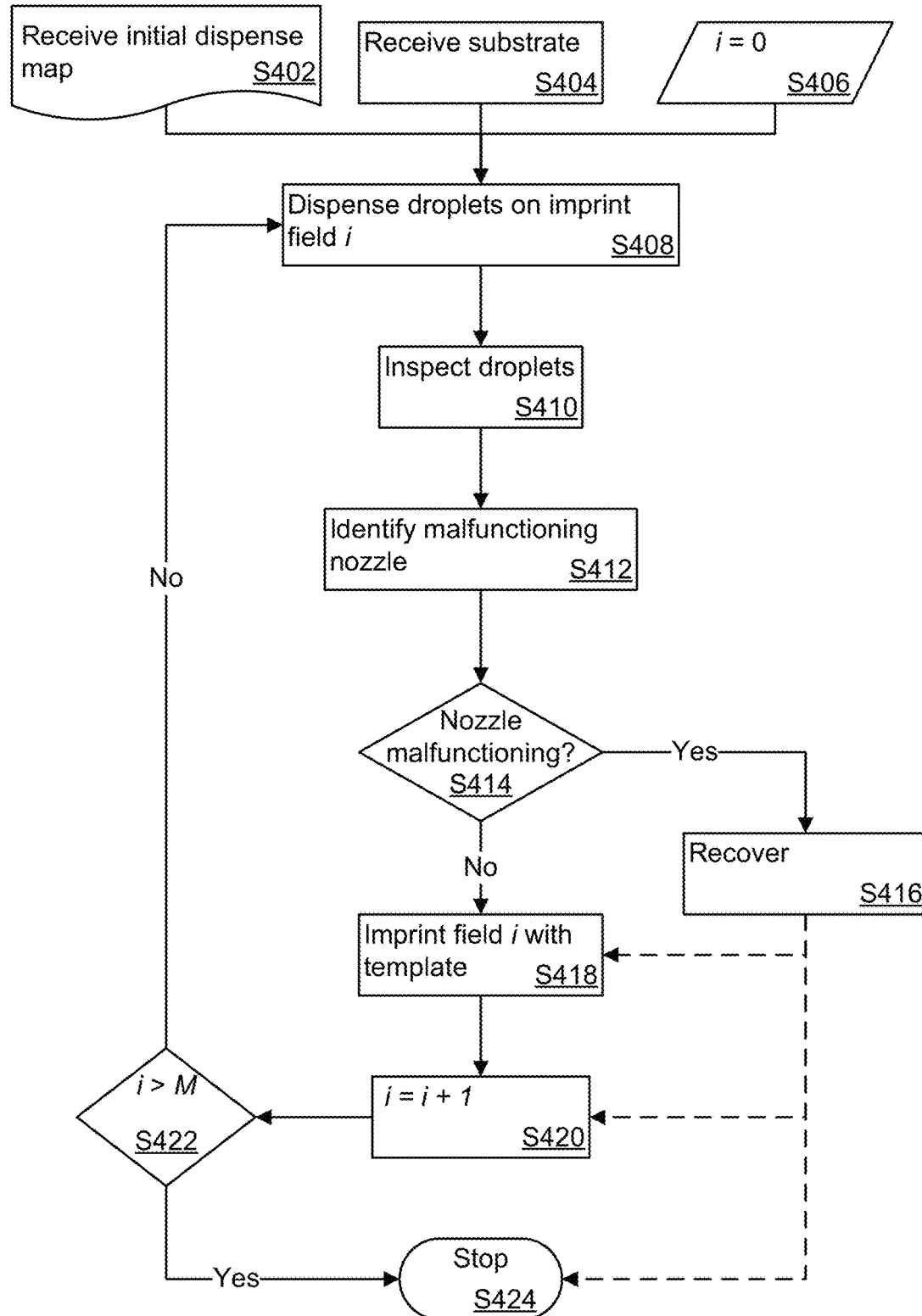
FIGS. 4A-4D are flow charts illustrating methods which may be used in an embodiment.

FIG. 4A is an illustration of a droplet inspection method 400a as may be implemented in an embodiment. The processor 132 may receive an initial dispense map in a step S402 which may include or may be used to determine sets of ejection signals which the processor 132 will send to the fluid dispenser 122. The dispense map is tuned for the topography of the substrate 102 and the template 108 and is a desired map of droplets which the fluid dispenser 122 will dispense in each imprint field.

The nanoimprint lithography system 100 will also receive a substrate 102 in a step S404, the substrate 102 is then held in the substrate chuck 104. A substrate handling system may be used to move the substrate 102 from a cassette of substrates onto the substrate chuck 104. The substrate 102 is divided into M imprint fields, in a step S406 an index i is initialized.

Figure 6A:
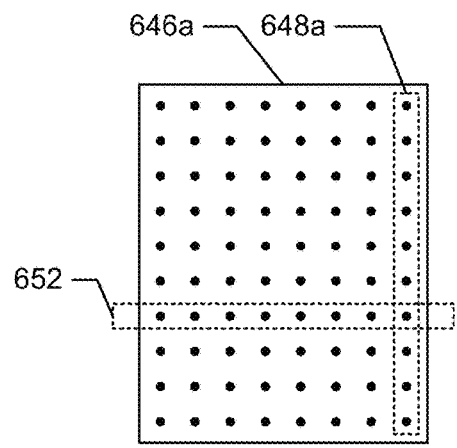
FIGS. 6A-B are images of droplets as they might be deposited onto a substrate during an embodiment.

In a dispensing step S408 the fluid dispenser 122 dispenses droplets onto the imprint field i in accordance with the initial dispense map received in step S402. The fluid dispenser 122 includes a line of nozzles that are configured to dispense a line of droplets onto a first location on the substrate in response to a first set of ejections signals. A positioning system including possibly the substrate positioning stage is configured to scan the fluid dispenser 122 and the substrate 102 relative to each such that a plurality of lines of droplets are dispensed across the imprint field as illustrated in FIG. 6A. The density of droplets and/or size of the droplets varies across the imprint field in accordance with the initial dispense map.

In an inspection step S410 a single line of droplets on the substrate is imaged with the droplet inspection system 138. In an alternative embodiment, two or more lines of droplets are optically averaged together with one or more cylindrical lenses. The inspection step S410 may be performed after or during the dispensing step S408. In an alternative embodiment, only a subset of the dispensed lines is inspected by the droplet inspection system. The inspection step S410 may include sending a droplet image from the droplet inspection system 138 to the processor 132 as a set of camera signals to the processor 132. In an embodiment, the droplet image is a line image that is sent from a line camera to the processor as a set of camera signals to the processor 132. The set of camera signals may be configured as one or more of an analog signal, a digital signal, or a structured digital file.

The processor 132 may perform an identification step S412 of analyzing the set of camera signals to identify one or more malfunctioning nozzles. Each droplet in the line image may appear as a dip in intensity as illustrated in FIGS. 6A-E or alternatively, as a rise in intensity. The applicant has found that for a nanoimprint process, the final yield is impacted by the position and volume accuracy with which the formable material is deposited on the substrate. A line image of these droplets which is obtained prior to imprinting can verify the accuracy of the deposition. The applicant has found that a line image of properly formed droplets can be compared to a line image template which corresponds to the line of droplets that is based on the initial dispense map, plus or minus a threshold. The line image template may also be based on the ejection signals. If the line image includes features that are outside of the line image template plus or minus a threshold, then the processor 132 will identify a malfunctioning nozzle that corresponds to the location of the mismatch between the line image and the line image template.

In an alternative embodiment, a plurality of measured droplet parameters is obtained for each droplet in the line of droplets based on the droplet image. The plurality of parameters may include but are not limited to droplet width, droplet position, and droplet image intensity. These parameters may be estimated using standard 1D feature analysis techniques similar to 2D image analysis techniques used for 2D droplet images. The processor 132 may store in memory 134 or calculate reference droplet parameter ranges which are predicted and/or measured depending on the initial dispense map and/or the ejection signals. The processor 132 may then compare the estimated droplet parameters to the reference droplet parameter ranges. If one or more of the estimated droplet parameters for a particular droplet is outside the reference droplet parameter ranges for that particular droplet, then the corresponding nozzle is identified as a malfunctioning nozzle.

After the droplet image is analyzed the processor 132 then decides how the process continues in a deciding step S414 based on the result of the identification step S412. If one or more malfunctioning nozzles are identified as a malfunctioning nozzle, then the process will move to a recovery step S416, which will be described latter, otherwise the process moves to an imprinting step S418.

The imprinting step S418 includes imprinting the formable material 124 in imprinting field i. A first part of the imprinting step S418 is moving the substrate 102 and the template 108 relative to each other such that the patterning surface 112 comes into contact with the formable material in imprint field i using one or more of the substrate positioning stage 104, a template positioning stage, z-axis voice coil positioning motors, piezoelectric template mag actuators, pressure actuators, and any additional components which allow the template to imprint the formable material 124. The formable material then spreads forming a liquid film between the template and the imprint field i of substrate 102. While the template is in contact with the liquid film, the liquid film is polymerized so as to form a solid film that is the inverse of the pattern in the imprint field i of the substrate 102. The liquid film may be polymerized so as to form a solid film with a curing system that includes energy source 126 that provides actinic energy to the liquid film through the template 102. The template 108 may then be lifted away from the solid film.

After the imprinting step S418 is the incrementing step S420, in which the index i is incremented by the processor 132. The new index i is then checked against the imprint field count M in a step S422. If the new index i is not greater than the imprint field count M then the process moves back to step S408. If the new index i is greater than the imprint field count M then the process moves to stopping step S424. During the stopping step the substrate S424 is removed from the nanoimprint lithography system 100.

The recovery process in step S416 may take many optional forms depending on the type of malfunction. In a first optional embodiment, the step S416 may include moving onto step S424, stopping the imprinting process 400 completely, and notifying an operator that there is an issue. When the process is stopped in this manner the partially imprinted substrate may or may not be removed from the nanoimprint lithography system 100. In a second optional embodiment, the step S416, may include fixing the malfunctioning nozzle in some way, and then moving onto step S420, in which case the imprinting step is skipped. The imprinting step S418 may be skipped if there is some worry of the imprinting process damaging the template given the current dispense pattern. In a third optional embodiment, the step S416, may include fixing the malfunctioning nozzle in some way, and then moving onto step S418, in which case the imprinting step is not skipped. The third optional embodiment, may include an additional dispense pass with a third set of ejections signals which compensate for the missing nozzles prior to step S418. A second set of ejection signals may then be used in subsequent imprint processes.

Fixing the malfunctioning nozzle may include an automated maintenance procedure, a manual maintenance procedure, droplet placement adjustment procedure, and/or adjusting the ejection signal magnitudes, etc.

Alternative Droplet Inspection Method B

Figure 4B:
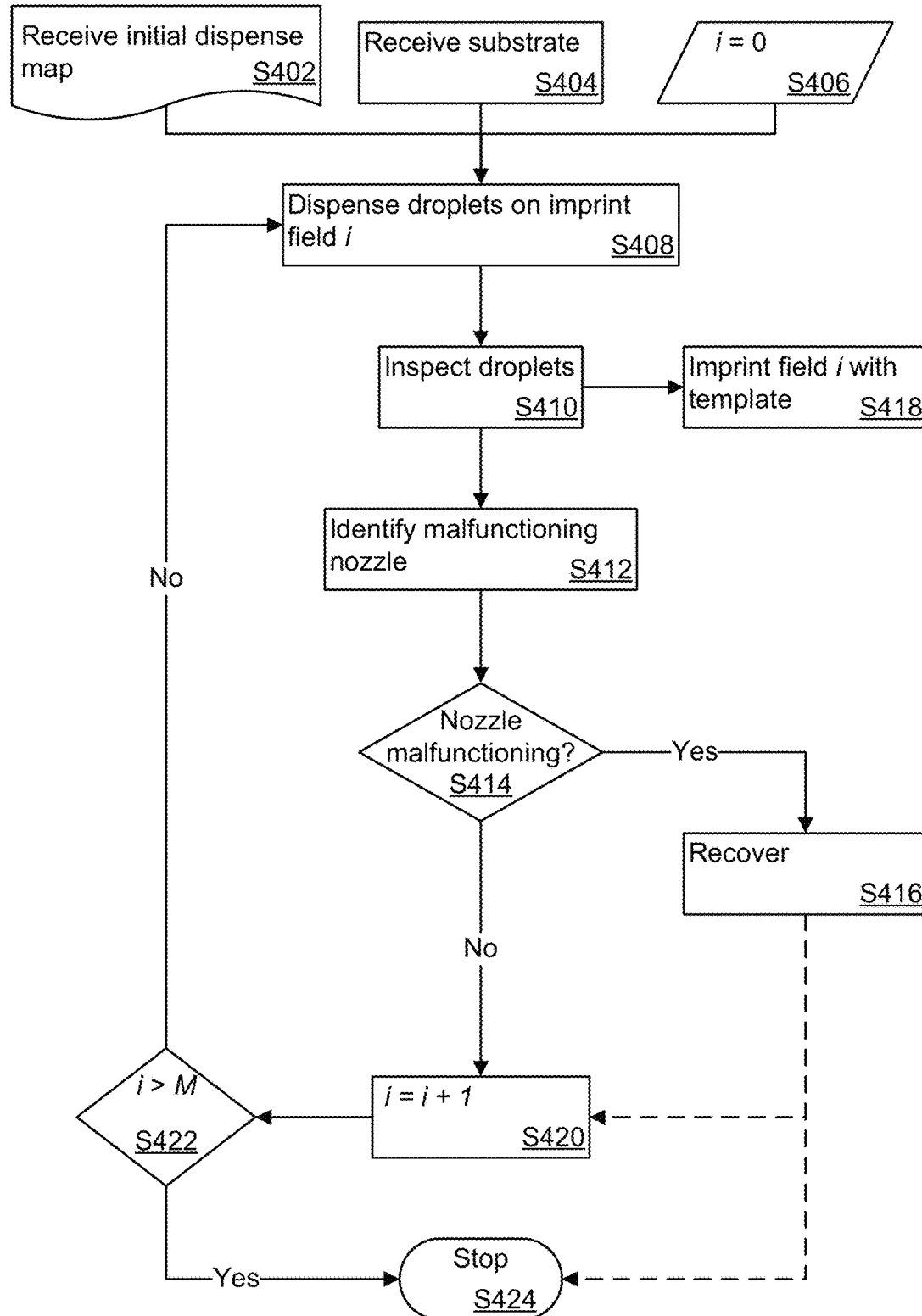

FIG. 4B is an illustration of an alternative droplet inspection method 400b which is substantially similar to droplet inspection method 400a. Except that the imprinting step S418 is performed in parallel with the steps S412, S414, and S416. This alternative process may be performed if more complicated analysis is performed, this does not prevent the template from being damaged from a poor dispense process but can ensure that the malfunctioning nozzle only impacts one imprint field.

Alternative Droplet Inspection Method C

Figure 4C:
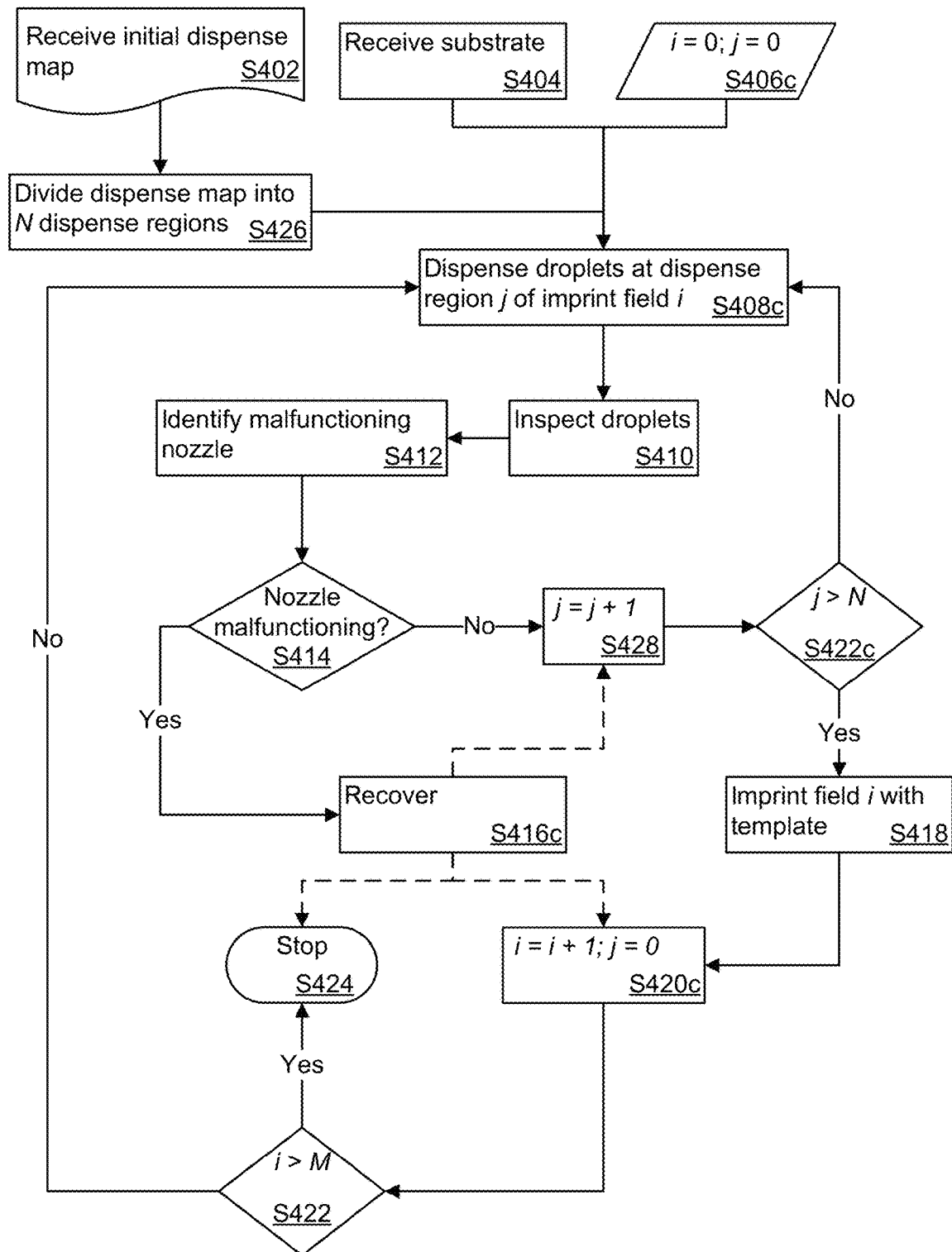

FIG. 4C is an illustration of an alternative droplet inspection method 400c which is substantially similar to droplet inspection method 400a. Except that the droplet inspection is performed during the droplet dispensing process. This alternative process may be performed when the analysis in steps S410 and S412 is performed faster than step S408c. After the initial dispense map is received, the process may divide the initial dispense map into N dispense regions in a division step S426. Wherein each dispense region j may include one or more lines of droplets. The initialization step S406c may include initializing both imprint field index i and dispense region index j. Alternative droplet inspection method 400c may include an alternative dispense step 408c that includes moving the substrate 102 and fluid dispenser 122 relative to each other such that fluid dispenser 122 dispenses droplets onto dispense region j of imprint field i.

In alternative droplet inspection method 400c, if none the nozzles are malfunctioning then the dispense region index j is incremented in a step S428. After which the new index j is then checked against the dispense region count N in a step S422c. If the new index j is not greater than the dispense region count N then the process moves back to step S408c. If the new index i is greater than the dispense region count N then the process moves to imprinting step S418. After the imprinting step S418 is the incrementing step S420c, in which the index i is incremented by the processor 132 and the dispense region index j is reinitialized. The recovery step 416c is substantially similar to the recovery step 416 except that the process may optionally move on to either steps S428, S424, or S420c after the recovery process.

Alternative Droplet Inspection Method D

Figure 4D:
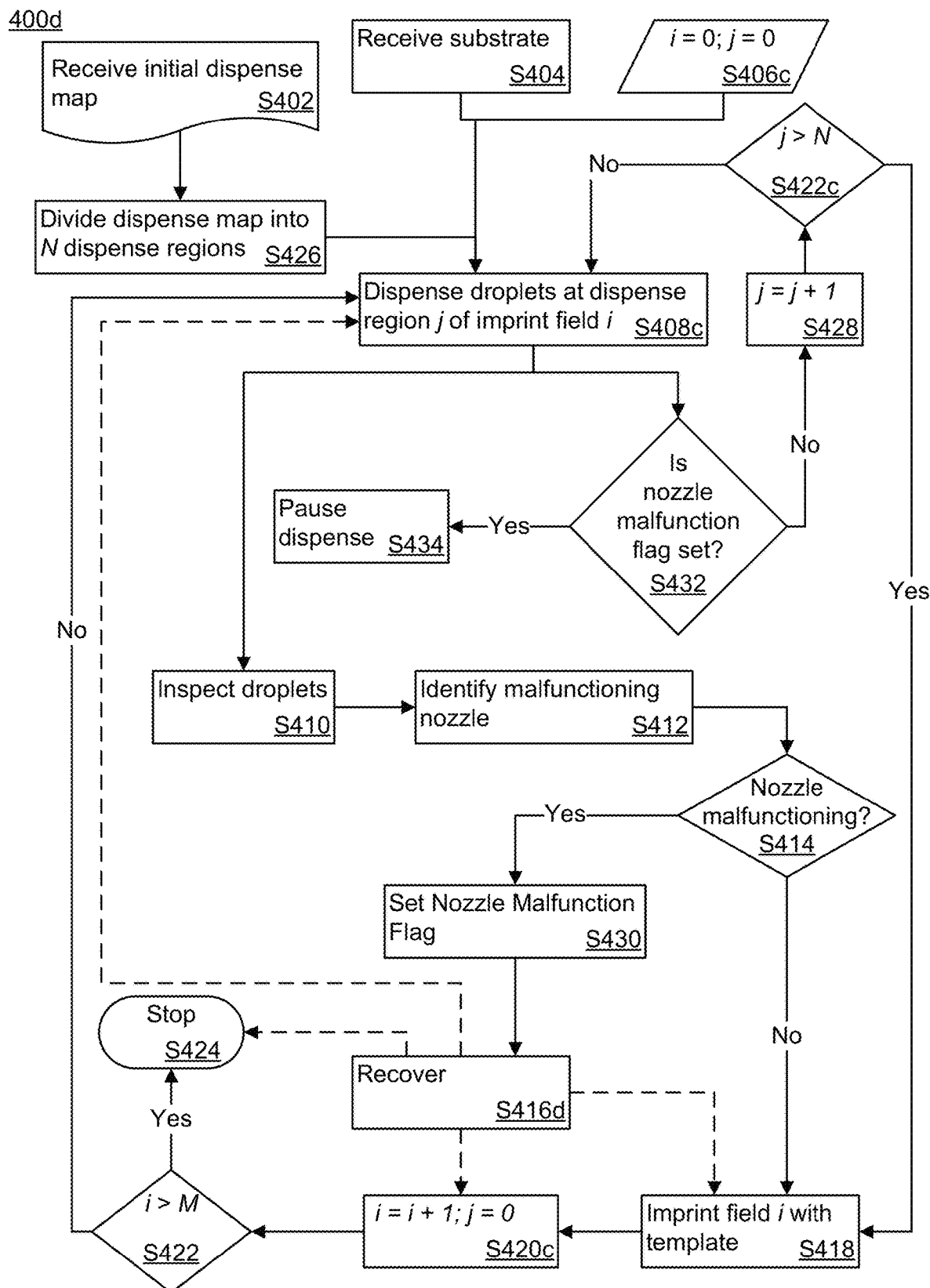

FIG. 4D is an illustration of an alternative droplet inspection method 400d which is substantially similar to droplet inspection method 400c. Except that the droplet inspection process is performed in parallel with the droplet dispensing process. In an embodiment, in method 400d, after dispense step S408c is performed for the first region, the droplet inspection process starts with step S410 and is performed for each dispense region j. Also after step S408c is performed, a nozzle malfunction flag is checked. The nozzle malfunction flag may also be checked during the dispense step S408c. In an alternative embodiment, the nozzle malfunction check process is an interrupt process which causes one or more processes to stop or be paused. If the nozzle malfunction flag is not set then the process moves on to step S428. If the nozzle malfunction flag is set, then the process is paused in a step S434. During step S434, the state of the dispensing process is saved and the dispensing process is paused while the recovery process during step 416d is initiated.

The recovery step 416d is substantially similar to step S416 except that a new set of ejection signals is used for the rest of the dispense regions after the process returns to step S408c. This recovery step S416d may also include clearing the nozzle malfunction flag and dispensing droplets based on the third set of ejection signals in previously dispensed regions which were missed due to the malfunctioning nozzles during a repeat of step S408c. A second set of ejection signals may then be used for the rest of the dispense regions as the dispense process proceeds through steps S432, S428, S422c, and S428.

Line Camera

Figure 5A:
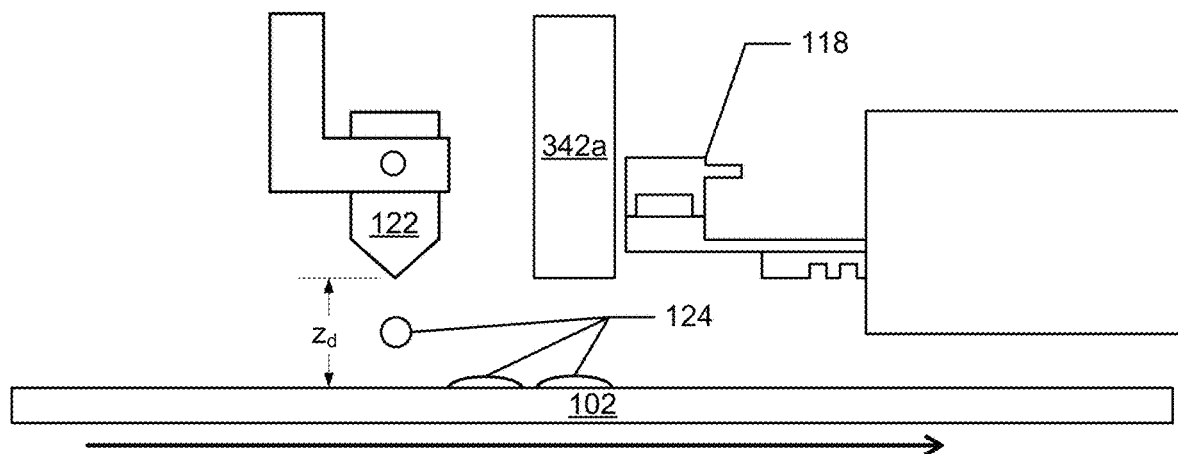
FIGS. 5A-C are illustrations of arrangements of components as they might be used in an embodiment.
Figure 5B:
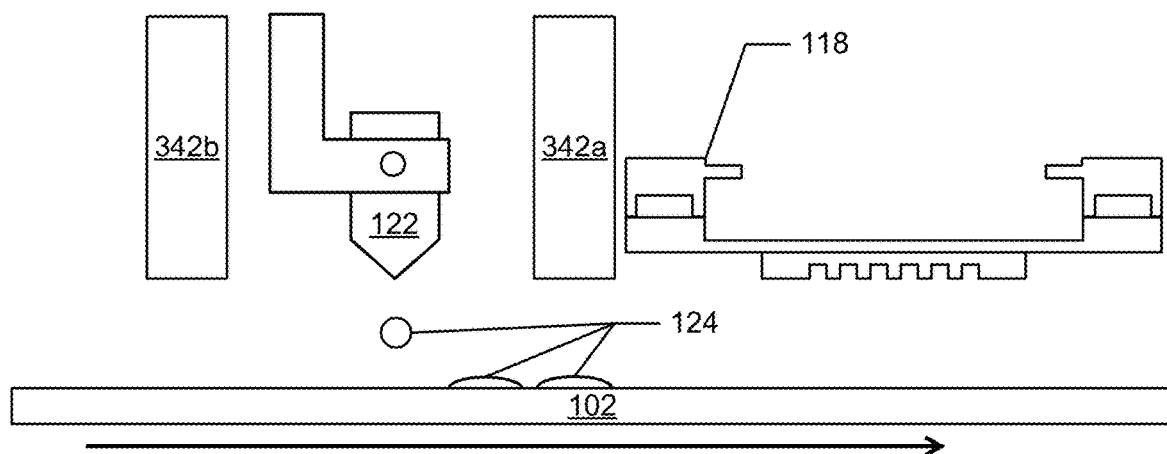
Figure 5C:
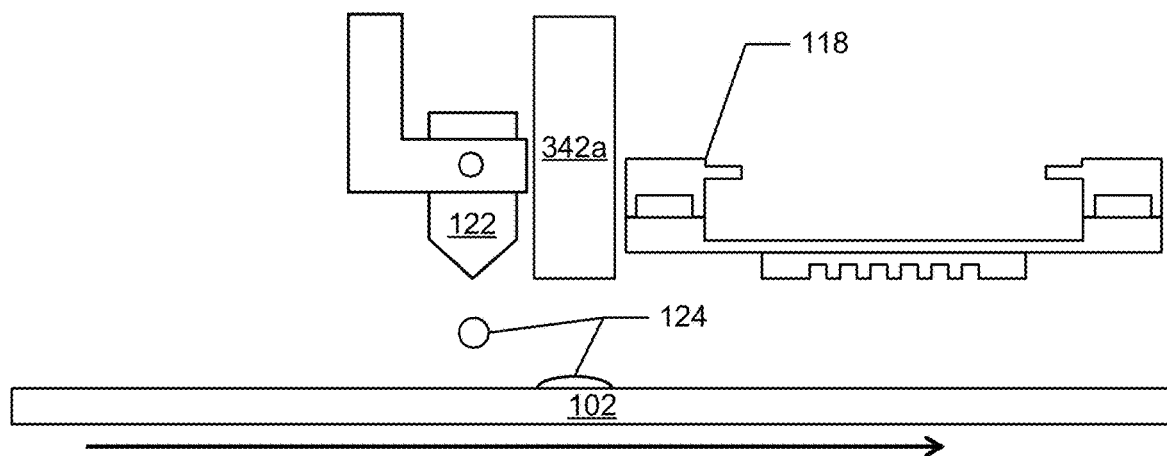

FIG. 5A is an illustration of how a line camera 342a may be positioned between fluid dispenser 122 and template chuck 118 and positioned above the substrate 102. A plurality of lines of droplets may be dispensed prior to the first line of droplets being imaged by the line camera. The fluid dispenser 122 dispenses formable material 124 which form droplets on the substrate 102. The line camera when positioned above a line of droplets can be used to obtain a line image of the deposited droplets on the substrate 102. The substrate positioning stage 106 can move the substrate 102 relative to the fluid dispenser 122, line camera 342a, and the template chuck 118. FIG. 5B illustrates an embodiment, in which two line cameras 342a-b are used, a second line camera 342b may be used to obtain a reference line image of a patterned substrate. FIG. 5C illustrates an embodiment, in which the line camera 342a is positioned such that a line image of a line droplets can be obtained prior to when a second line of droplets are dispensed by the fluid dispenser 122.

In an embodiment, the fluid dispenser 122 may dispense a first line of droplets in a first region of a first imprint field on the substrate. The fluid dispenser 122 and the substrate 102 are then moved relative to each other so that the fluid dispenser may dispense a second line of droplets in a second region of the first imprint field. Additional lines of droplets may be dispensed onto additional regions of the first imprint field. The line camera 342a may inspect one or more lines of droplets on the substrate, after the droplets are dispensed. After the droplets are dispensed, the template chuck may be used to imprint the droplets in the imprint field. The relative movement of the fluid dispenser 122 and the substrate 102 may be performed by one or more of the substrate positioning stage 106, a fluid dispenser positioning stage, and a bridge positioning stage. In an alternative embodiment, the line camera 342a is positioned so as to image a first line of droplets, while the substrate is moving to a position in which a line of droplets is to be dispensed. In an alternative embodiment, the fluid dispenser dispenses all of the droplets in an imprint field, and line camera is then used to inspect all of the droplets in the imprint field.

Figure 6B:
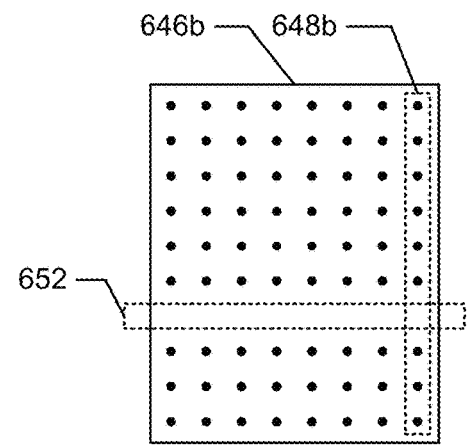
Figure 6C:
FIGS. 6C-D are line images of droplets as they might be deposited onto a substrate during an embodiment.
Figure 6D:
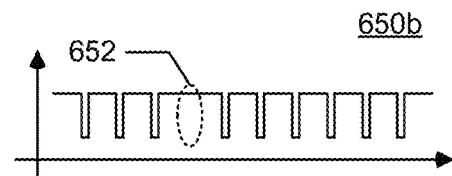

FIG. 6A is an illustration of an image 646a of droplets obtained with a 2D photodiode array 342c in a comparative example. A line camera 342a can be positioned to obtain an image of only one line in the array of droplets in region 648a. The line camera 342a can then produce a line image 650a illustrated in FIG. 6C. When a nozzle becomes clogged or otherwise malfunctions an array of droplets with a line of missing droplets is produced as shown in image 646b as illustrated in FIG. 6B. As before, the line camera 342a obtains a line image 650b of region 648b as illustrated in FIG. 6D. The clogged nozzle will appear as missing notch during time period 652 as illustrated in FIGS. 6D-E.

Figure 6E:
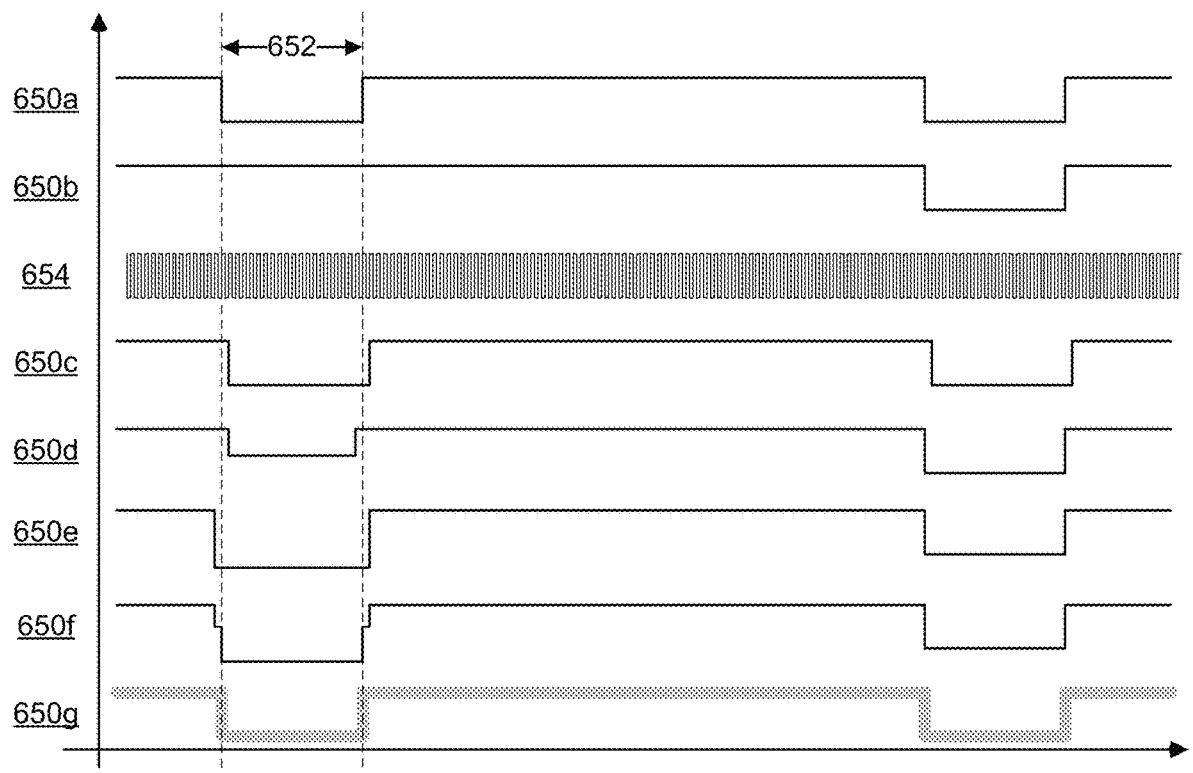
FIG. 6E is an illustration of line images relative to a pixel clock and a threshold range as may be used in an embodiment.

FIG. 6E is an illustration of a portion of line images 650a-f in which two droplets in the line images are shown relative to a pixel clock 654. Line image 650c is representative of an image that represents a droplet that is deposited by a nozzle which is offset from its calibrated position. In an embodiment, a processor 132 may receive line image 650c and compare the line image to a representative line image, one or more thresholds, a bit mask etc., to determine that nozzle is offset from its calibrated position. The nanoimprint lithography system 100 may adjust the driving of one or more positioning stages in response to the detection of the offset. The results of multiple nozzles across multiple lines of droplets may be used to determine an average offset.

Line image 650d is representative of an image that represents a smaller than expected droplet that is deposited by a malfunctioning nozzle. The processor 132 may compare line image 650d to one more thresholds on the notch width, notch intensity, and/or pixel count to determine the size of the droplet. In an embodiment, the nanoimprint lithography system 100 may in response to determining that the droplet is too small, and is within an adjustable range, than the processor 132 may determine a new ejection signal to send that increases the size of the droplet ejected by the malfunctioning nozzle.

Line image 650e is representative of an image that represents a larger than expected droplet that is deposited by a malfunctioning nozzle. The processor 132 may compare line image 650e to one more thresholds on the notch width, intensity, and/or pixel count to determine the size of the droplet. In an embodiment, the nanoimprint lithography system 100 may in response to determining that the droplet is too large, and is within an adjustable range, then the processor 132 may send a new ejection signal that decreases the size of the droplet ejected by the malfunctioning nozzle. Line image 650f also illustrates a larger than expected droplet, that has an increase in size which is not aligned with pixels of the line camera. In an embodiment, multiple line images may be averaged together.

The line image 650 may be compared to a line image template 650g plus or minus a threshold as illustrated in FIG. 6E. In FIG. 6E the threshold is illustrated by the thickness of the line image template 650g. A position where the line image deviates from the line image template corresponds to a malfunctioning nozzle. In an alternative embodiment, image analysis is used to obtain parameters such as position, width, intensity, etc. are used to represent the droplets. These parameters are then compared to threshold ranges. When the parameters are outside a range then the droplet is determined to be produced by a corresponding malfunctioning nozzle.

Optical System of Droplet Inspection System

Figure 7A:
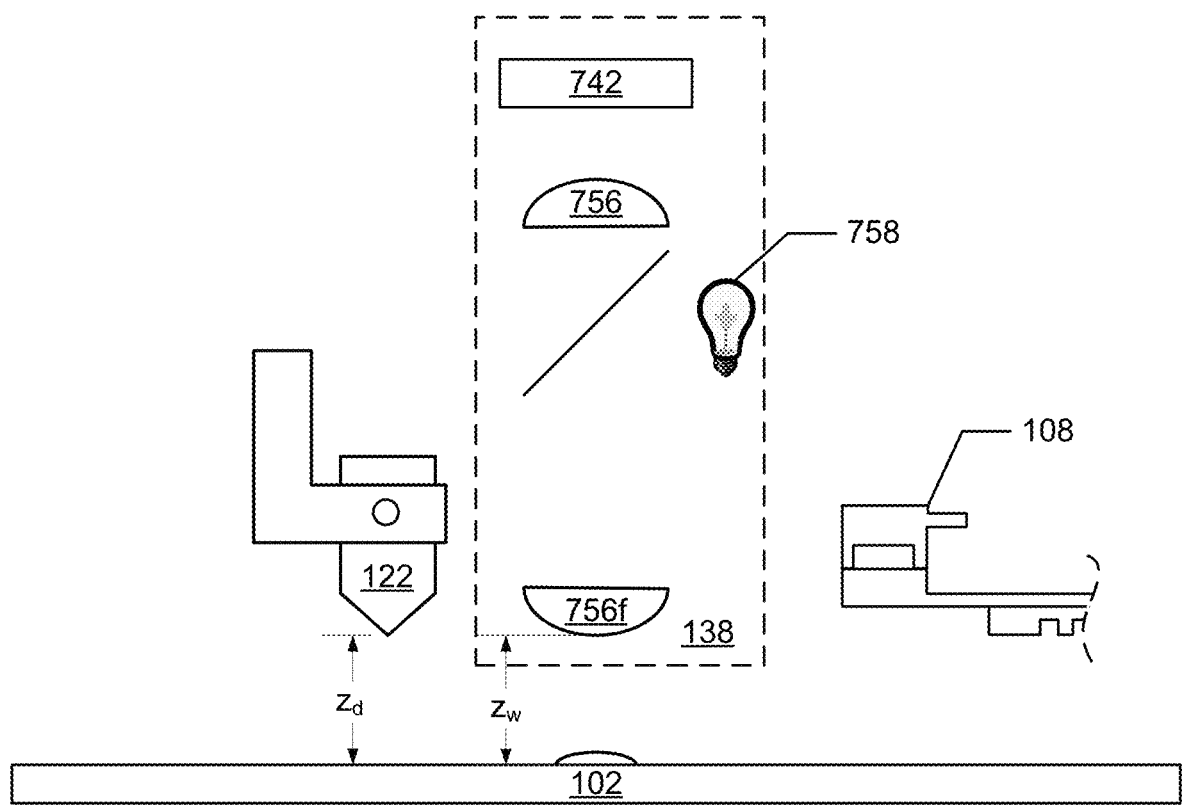
FIG. 7A is an illustration of a droplet inspection system as may be used in an embodiment.
Figure 7B:
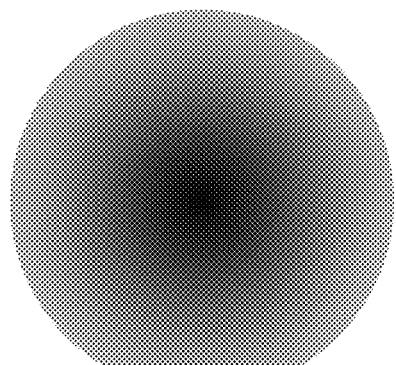
FIGS. 7B-C are illustrations of lenses that may be used in a droplet inspection system.
Figure 7B:
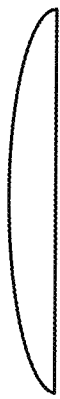

The droplet inspection system 138 may include one or more additional optical components 756 as illustrated in FIG. 7A. In an embodiment, the droplet inspection system 138 includes a front focal lens 756f that is positioned between the fluid dispenser 122 and the template chuck 108. A front surface of a front focal lens 756f is positioned a working distance ($z_w$) above the substrate 102. In an embodiment, the working distance ($z_w$) is equal to or within 10 mm of dispense height ($z_d$) ($z_w=z_d\pm10$ mm). The applicant has found that when a cylindrical lens and a line camera are used together the working distance can be reduced to less than 20 mm (i.e. 1-20 mm) while meeting additional criteria of imaging a line of droplets in the imprint field and keeping the distance between the imprint template and the dispenser narrow so as to improve throughput and minimize the effect of droplet shrinkage. This is as opposed to an embodiment that makes use of circular front focal lens in which the working distance may need to be greater than 200 mm if the distance between the dispenser and the template is to be kept narrow enough to ensure proper throughput reduce droplet shrinkage. The droplet inspection system 138 may include a droplet imaging light source 758 or receive light from the droplet imaging light source 758. The droplet inspection system 138 may include a beam splitter which combines light from the droplet imaging light source 758 with an imaging path of for example a line camera 742. The droplet imaging light source 758 may be positioned such that it does not substantially heat up the template 108. The droplet imaging light source 758 may produce light at 500 nm or above and does not produce actinic radiation which would polymerize the formable material 124. In an embodiment, the droplet imaging light source 758 has a wavelength that provides contrast between the substrate and the droplet, either by refraction, absorption, fluorescence. In one embodiment, the droplet appears darker than the substrate, in an alternative embodiment, the droplet appears lighter than the substrate. The additional optical components may be mirrors, apertures, or lenses. The optical components 756 may include spherical lenses as illustrated in FIG. 7B. The spherical lenses may be plano-convex lenses or other types of lenses. The optical components may be arranged as an optical relay line as illustrated in FIG. 7A.

Figure 7C:
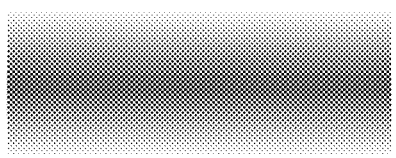
Figure 7C:

The additional optical components may include one or more cylindrical lenses 756*b* as illustrated in FIG. 7C. The cylindrical lenses are planar along a first axis and may have a radial profile along a second axis. The cylindrical lenses 756*b* may be plano-convex lenses or other types of lenses. The cylindrical lenses 756*b* are positioned such that the second axis is aligned with both a line of deposited droplets and a line of photodiodes in a line camera 742 as illustrated in FIG. 7A.

In an alternative embodiment, the optical axes of one or more optical components, including the cylindrical lens 765*b*, are not aligned with each other, such that one or more line of droplets being imaged are underneath one or more components of the fluid dispenser 122 not including the dispense nozzles. This would allow the droplet inspection system 138 to image a line of droplets while an adjacent line of droplets are being dispensed. The droplet inspection system 138 may include one or more apertures, such that only a particular one or more line of droplets are imaged. In an alternative embodiment, the droplet imaging light source 758 is a pulsed light source that is synced with the motion of the substrate 102 relative to the droplet inspection system 138.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An apparatus comprising:
   a processor;
   a substrate chuck configured to hold a substrate;
   a fluid dispenser having a plurality of nozzles, each nozzle configured to eject droplets of formable material onto the substrate in response to ejection signals received from the processor,
      wherein the fluid dispenser, in response to a first set of ejection signals, dispenses a first line of ejected droplets of formable material onto a first location on the substrate; and
   a line camera positioned to generate a set of camera signals,
      wherein a first set of camera signals are representative of the first line of ejected droplets;
   wherein the processor is configured to receive the first set of camera signals;
   wherein the processor is further configured to analyze the first set of camera signals to identify one or more malfunctioning nozzles among the plurality of nozzles;
   wherein the processor is further configured to generate a second set of ejection signals;
   wherein the fluid dispenser, in response to the second set of ejection signals, dispenses a second line of ejected droplets of formable material onto a second location on the substrate; and
   wherein the second set of ejection signals compensate for the one or more malfunctioning nozzles.

2. The apparatus according to claim 1, wherein the one or more malfunctioning nozzles are non-functioning nozzles which do not produce droplets as determined by one or more signals among the first set of camera signals.

3. The apparatus according to claim 1, wherein the one or more malfunctioning nozzles are low performing nozzles which produce droplets that are the wrong size or position as determined by one or more signals among the first set of camera signals.

4. The apparatus according to claim 1 further comprising:
   a template chuck configured to hold a template;
   a positioning system configured to position the substrate chuck relative to the template chuck, such that the template contacts a first plurality of droplets in a first imprint field on the substrate;
      wherein the first imprint field is among a plurality of imprint fields;
      wherein the first plurality of droplets includes the first line of ejected droplets of formable material; and
      wherein the first plurality of droplets form a first film between the template and the first imprint field of the substrate after the template contacts the first plurality of droplets;
   a curing system configured to expose the first film to actinic radiation, while the template is in contact with the first film; and
   wherein after the first film has been exposed to actinic radiation, the positioning system is further configured to position the substrate chuck relative to the template chuck, such that the template does not contact the first film which has been cured by the actinic radiation.

5. The apparatus according to claim 4, wherein:
   the positioning system is further configured to position the substrate chuck relative to the template chuck, such that the template contacts a second plurality of droplets in a second imprint field on the substrate;
   the second imprint field is among the plurality of imprint fields;
   the second plurality of droplets includes the second line of ejected droplets of formable material;
   the second plurality of droplets form a second film between the template and the second imprint field of the substrate after the template contacts the second plurality of droplets;
   the curing system is further configured to expose the second film to actinic radiation, while the template is in contact with the second film;
   wherein after the second film has been exposed to actinic radiation, the positioning system is further configured to position the substrate chuck relative to the template chuck, such that the template does not contact the second film which has been cured by the actinic radiation.

6. The apparatus according to claim 5, wherein the second film after it has been cured includes less defects than the first film after it has been cured by the actinic radiation.

7. The apparatus according to claim 4, wherein the first plurality of droplets includes the second line of ejected droplets of formable material.

8. The apparatus according to claim 7, wherein one or more additional lines of ejected droplets of formable material are dispensed in between the first lines of ejected droplets and the second line of ejected droplets.

9. The apparatus according to claim 4, wherein a cylindrical lens aligned with the line camera is positioned in between the fluid dispenser and the template chuck.

10. The apparatus according to claim 1, further comprising one or more lenses,
wherein the one or more cylindrical lenses are positioned so as to focus the first line of ejected droplets of formable material onto the line camera.

11. The apparatus according to claim 1, wherein
the fluid dispenser is further configured to dispense M lines of ejected droplets in a first imprint field including the first line of ejected droplets;
the line camera is further configured to obtain N sets of camera signals including the first set of camera signals, each set of camera signals among the N sets of camera signals is associated with one of the M lines of ejected droplets;
wherein N is less than M.

12. The apparatus according to claim 1, wherein:
the fluid dispenser is further configured to dispense fluid from a first set of nozzles in response to the first set of ejection signals;
the fluid dispenser is further configured to dispense fluid from a second set of nozzles in response to the second set of ejection signals;
the second set of nozzles does not include the one or more malfunctioning nozzles;
one or more nozzles among the second set of nozzles are offset from the first set of nozzles.

13. The apparatus according to claim 1, wherein:
in a first case if the processor does not identify one or more malfunctioning nozzles then the fluid dispenser is further configured to dispense a plurality of lines of ejected droplets in an imprint field including the first line of ejected droplets in a single pass; and
in a second case if the processor does identify one or more malfunctioning nozzles then the fluid dispenser is further configured to dispense the plurality of lines of ejected droplets in the imprint field including the second line of ejected droplets in two or more passes, and the one or more malfunctioning nozzles are not used to dispense droplets.

14. The apparatus according to claim 1, wherein:
in a first case if the processor does not identify one or more malfunctioning nozzles then the fluid dispenser is further configured to dispense a plurality of lines of ejected droplets in an imprint field including the first line of ejected droplets in two or more passes; and
in a second case if the processor does identify one or more malfunctioning nozzles then the fluid dispenser is further configured to dispense the plurality of lines of ejected droplets in the imprint field including the second line of ejected droplets in the two or more passes, and the one or more malfunctioning nozzles are not used to dispense droplets.

15. The apparatus according to claim 1, wherein:
the line camera includes a plurality of pixels arrayed in one direction;
each pixel among the plurality of pixels is a photoelectric conversion element;
an intensity of electromagnetic radiation detected by each of the pixels of the line camera is represented by an element of the set of camera signals;
each droplet among the first line of ejected droplets is associated with one or more elements of the first set of camera signals;

the processor determines if a particular nozzle is a malfunctioning nozzle by comparing one or more elements of the first set of camera signals associated with the particular nozzle to one or more thresholds.

16. A method of manufacturing an article on a substrate with an imprinting apparatus comprising:
holding the substrate;
dispensing a first line of ejected droplets of formable material from a plurality of nozzles onto a first location on the substrate in response to a first set of ejection signals;
generating a set of camera signals from a line camera that are representative of the first line of ejected droplets;
analyzing the first set of camera signals to identify one or more malfunctioning nozzles among the plurality of nozzles; and
dispensing a second line of ejected droplets of formable material from the plurality of nozzles onto a second location on the substrate in response to a second set of ejection signals; and
wherein the second set of ejection signals compensate for the one or more malfunctioning nozzles.

17. The method according to claim 16, further comprising:
positioning the substrate relative to the template, such that the template contacts a first plurality of droplets in a first imprint field on the substrate;
wherein the first imprint field is among a plurality of imprint fields;
wherein the first plurality of droplets includes the first line of ejected droplets of formable material; and
wherein the first plurality of droplets form a first film between the template and the first imprint field of the substrate after the template contacts the first plurality of droplets;
exposing the first film to actinic radiation, while the template is in contact with the first film; and
positioning the substrate relative to the template, such that the template does not contact the first film which has been cured by the actinic radiation.

18. The according to claim 17, wherein positioning the substrate relative to the substrate includes moving the substrate relative to the plurality of nozzles and the line camera, wherein the first set of camera signals are generated as the substrate moves from under the plurality of nozzles to under the template.

19. The method according to claim 16 further comprising performing additional processes for device fabrication on the substrate so as to manufacture the article.

20. An apparatus comprising:
a processor;
a substrate positioning stage configured to move a substrate;
a fluid dispenser having a plurality of nozzles, each nozzle configured to eject droplets of formable material onto the substrate on the substrate positioning stage;
a template chuck configured to hold a template; and
a line camera arranged on a straight line connecting the template chuck and the fluid dispenser and including a plurality of pixels arranged in a direction crossing the straight line;
wherein the line camera is positioned to generate a set of camera signals representing a line of droplets ejected from the plurality of nozzles in response to an obtained light from the substrate moving together with the substrate positioning stage, and wherein the processor is configured to analyze the set of camera signals to identify one or more malfunctioning nozzles among the plurality of nozzles.

\* \* \* \* \*